(12) United States Patent
Uebayashi et al.

(10) Patent No.: US 9,146,257 B2
(45) Date of Patent: Sep. 29, 2015

(54) CONTACT PROBE AND PROBE CARD

(71) Applicant: Kabushiki Kaisha Nihon Micronics, Tokyo (JP)

(72) Inventors: Masatomo Uebayashi, Tokyo (JP); Akira Souma, Tokyo (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 96 days.

(21) Appl. No.: 13/960,960

(22) Filed: Aug. 7, 2013

(65) Prior Publication Data

US 2014/0043055 A1    Feb. 13, 2014

(30) Foreign Application Priority Data

Aug. 10, 2012 (JP) ................................. 2012-178393

(51) Int. Cl.
*G01R 31/00* (2006.01)
*G01R 1/067* (2006.01)

(52) U.S. Cl.
CPC ............ *G01R 1/067* (2013.01); *G01R 1/06727* (2013.01); *G01R 1/06733* (2013.01)

(58) Field of Classification Search
CPC ....................................................... G01R 1/067
See application file for complete search history.

(56) References Cited

U.S. PATENT DOCUMENTS

| 7,449,906 | B2 | 11/2008 | Miura et al. |
| 7,924,038 | B2 | 4/2011 | Kuniyoshi et al. |
| 2010/0219854 | A1 | 9/2010 | Kuniyoshi et al. |
| 2014/0009182 | A1* | 1/2014 | Nasu et al. ............... 324/754.11 |

FOREIGN PATENT DOCUMENTS

| JP | 2000193681 A | 7/2000 |
| JP | 2009162483 | 7/2009 |
| JP | 2009229410 | 10/2009 |
| JP | 201078617 A | 4/2010 |
| KR | 1020080085132 | 9/2008 |
| TW | I349106 | 9/2011 |
| WO | 2004102207 A | 11/2004 |

OTHER PUBLICATIONS

Korean Patent Office First Office Action issued on Jun. 20, 2014 for Korean Patent Application 10-2012-0080852.

* cited by examiner

*Primary Examiner* — Vincent Q Nguyen
(74) *Attorney, Agent, or Firm* — Bacon & Thomas, PLLC (57) ABSTRACT

A contact probe electrically connects the tester side and an electrode pad of a circuit to be tested. This contact probe has a mounting portion on a base end portion mounted on a probe card, a contact portion on a distal end portion brought into contact with the electrode pad, and an arm portion between them elastically supporting the contact portion. The contact portion is provided on a lower end portion of a base portion integrally mounted on a distal end portion of the arm portion. The arm portion has a one-side arm piece supporting the base portion and allowing vertical movement of the base portion and the other-side arm piece supporting the base portion and adjusting an inclination angle of the base portion to reduce a scrub amount of the contact portion. The probe card uses the above-described contact probe.

6 Claims, 6 Drawing Sheets

CONTACT PROBE AND PROBE CARD

CROSS-REFERENCE TO RELATED APPLICATION

This application claims, under 35 USC 119, priority of Japanese Application No. 2012-178393 filed on Aug. 10, 2012.

BACKGROUND OF THE INVENTION

1. Technical Field Relating to the Invention

The present invention relates to a cantilever-type contact probe and a probe card used in an electrical current test and the like.

2. Description of Related Art

Density and integration of semiconductor integrated circuits have become higher with recent technical development, and with that trend, the size of an electrode pad of the semiconductor integrated circuit has become smaller. In order to cope with this, a distal end of a contact probe needs to be made smaller in accordance with the size of the electrode pad in order to conduct a stable electrical current test of a semiconductor integrated circuit. Moreover, a distal-end scrub amount when a load is applied to the contact probe (in overdrive in which a distal end portion of the contact probe is lifted up by a reaction force from the electrode pad side) also needs to be reduced.

Prior-art technologies of reducing a scrub amount in accordance with the electrode pad which has become smaller due to higher density of the circuit and the like include a cantilever-type contact probe described in Patent Document 1 (Japanese Patent Laid-Open No. 2009-229410) and a vertical contact probe described in Patent Document 2 (Japanese Patent Laid-Open No. 2009-162483), for example.

In the case of the vertical contact probe (vertical probe), a fulcrum portion (foot portion) connected to and supported by the probe card side and a distal end portion in contact with the electrode pad on the circuit side are not spaced apart from each other in the XY direction (horizontal direction), and thus, very little scrub occurs. However, in the case of the vertical probe, connection of the probe to the probe card during assembling of the probe card is difficult, and since a pitch between each probe is restricted in principle, the electrode pad which has become smaller due to higher density of the circuit and the like cannot be accommodated easily.

On the other hand, the cantilever-type contact probe can accommodate the electrode pad which has become smaller due to higher density of the circuit and the like. Moreover, in the case of the cantilever-type contact probe, the foot portion and the distal end portion are spaced apart from each other in the XY direction, but it is set such that, when overdrive is applied (hereinafter referred to as "OD"), scrub occurs within a range of the size of the electrode pad in accordance with this OD.

SUMMARY OF THE INVENTION

However, the prior-art cantilever-type contact probe has the following problems.

In the prior-art contact probe, when OD is applied, certain scrub occurs on the electrode pad in accordance with the OD, but if density of the circuit and the like continues to increase, accommodation of the electrode pad becomes difficult. That is, if the electrode pad becomes smaller due to higher density of the circuit and the like, the scrub amount becomes relatively larger, and nonconformity occurs that the distal end portion of the contact probe goes out of the electrode pad during scrub.

Moreover, if there is variation in height between contact probes, distortion in the probe card or the like, such nonconformity is caused that an effective OD amount applied to each probe varies among the contact probes in one probe card plane.

The present invention was made in view of the above-described problems and has an object to provide a contact probe and a probe card which can accommodate further size reduction of the electrode pad and can keep the scrub amount within a certain range regardless of a difference in the effective OD amount applied to each probe.

A contact probe according to the present invention is a contact probe supported by a probe card substrate on the tester side and extended to an electrode pad of a circuit to be tested, and electrically connecting the tester side and the electrode pad of the circuit to be tested, provided with a mounting portion located on a base end portion and mounted on the probe card substrate on the tester side, a contact portion located on a distal end portion and brought into contact with the electrode pad of the circuit to be tested, and an arm portion located between them and elastically supporting the contact portion, characterized in that the contact portion is provided on a lower end portion of a base portion integrally mounted on a distal end portion of the arm portion, and the arm portion is provided with a one-side arm piece supporting the base portion and allowing vertical movement of the base portion and the other-side arm piece supporting the base portion and adjusting an inclination angle of the base portion so as to reduce a scrub amount of the contact portion.

The probe card according to the present invention is characterized by using the above-described contact probe.

The contact probe and the probe card according to the present invention can accommodate further size reduction of the electrode pad. Moreover, even if the effective OD amount applied to each probe is different due to distortion of the probe card and the like, the scrub amount can be kept within a certain range.

DETAILED DESCRIPTION OF THE PREFERRED EMBODIMENTS

Figure 10:
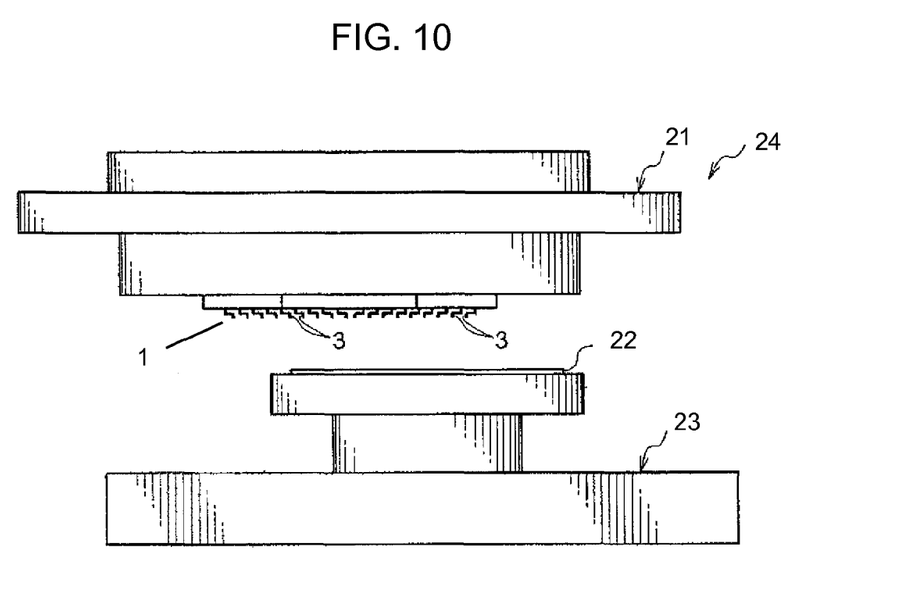
FIG. 10 is a schematic view of a testing device with a probe card substrate with a plurality of contact probes for contact with electrode pads of a semiconductor circuit to be tested.

A contact probe and a probe card according to an embodiment of the present invention will be described below by referring to the attached drawings. The contact probe of this embodiment is incorporated in the probe card in accordance with the number of semiconductor devices to be inspected and the number of electrode pads of each device. That is, a plurality of contact probes is mounted on the probe card. This probe card supports the plurality of contact probes and is mounted on a tester for testing the semiconductor device and the like. As the probe card, a probe card shown in FIG. 1 of Patent Document 1 can be cited, for example, but the present invention can be applied to all the probe cards on which the contact probe according to this embodiment can be mounted. Thus, the explanation of the probe card itself will be left to Patent Document 1 and the like, and the contact probe to be mounted on such probe card as shown in FIG. 10 will be mainly described below. As shown in FIG. 10, probe card 21 contains a plurality of contact probes 1 for contact with pads on the semiconductor circuit 22 mounted on a testing stage 23 of testing device 24.

A contact probe of this embodiment is a cantilever-type contact probe as shown in FIGS. 1 to 4. This contact probe 1 is formed by plating a metal material, for example. A dimension of this contact probe 1 is approximately several mm. The contact probe 1 mainly includes a mounting portion 2 located on a base end portion (end portion on the upper right in FIG. 1), a contact portion 3 located on a distal end portion (an end portion on the lower left in FIG. 1), and an arm portion 4 located between them.

The above-described mounting portion 2 is a portion to be mounted on the probe card on the tester side. The mounting portion 2 is formed having a substantially square plate shape. On this mounting portion 2, a support rod portion 6 is formed. The support rod portion 6 is formed of a rod material extending downward from the mounting portion 2. A base end portion of the arm portion 4 is integrally mounted on this support rod portion 6.

The above-described contact portion 3 is a portion brought into contact with an electrode pad (not shown) of a circuit to be tested. The contact portion 3 is provided on a distal end portion (lower end portion) of a base portion 7. This base portion 7 is integrally mounted on the distal end portion of the arm portion 4. The base portion 7 is a member supported by the arm portion 4 and is vertically moved. Due to a reason which will be described later, it is configured such that the base portion 7 is vertically moved when OD is applied, and a scrub amount of the contact portion 3 is within a dimension of the electrode pad.

The above-described arm portion 4 is a member for elastically supporting the contact portion 3. The arm portion 4 is formed of the above-described metal material and the like so as to be elastically deformed. The arm portion 4 is composed of a lower arm piece 8 and an upper arm piece 9.

The lower arm piece 8 is a one-side arm piece for supporting the above-described base portion 7 (contact portion 3) and allowing vertical movement of the base portion 7 (contact portion 3) with application of OD. The lower arm piece 8 is composed of a linear rod material. The lower arm piece 8 is integrally mounted on the support rod portion 6 on the mounting portion 2 side and the base portion 7 on the contact portion 3 side. As a result, when OD is applied, the lower arm piece 8 supports the base portion 7 (contact portion 3) fixed to the distal end portion thereof so as to draw an arc using its base end portion (a connection portion with the support rod portion 6 on the mounting portion 2 side) as a rotation center.

On the other hand, the upper arm piece 9 is the other arm piece for supporting the base portion 7 (contact portion 3) and adjusting an inclination angle so that the scrub amount of the contact portion 3 becomes smaller. The upper arm piece 9 is formed of a curved rod material. Specifically, the upper arm piece 9 is composed of a distal-end side curved arm piece 11 extending from the distal end portion (contact portion 3) side and a base-end side curved arm piece 12 extending from the base end portion (mounting portion 2) side. The distal-end side curved arm piece 11 is formed of a curved rod material protruding upward (a center of curvature is located on a lower side). The base-end side curved arm piece 12 is formed of a curved rod material protruding downward (a center of curvature is located on an upper side). The distal-end side curved arm piece 11 and the base-end side curved arm piece 12 are integrally connected to each other at the distal end position and the intermediate position so as to constitute the upper arm piece 9.

Here, the distal-end side curved arm piece 11 is assumed to be divided into the base end portion 11a and the distal end portion 11b (See FIG. 4) at a connection portion 14 with a contact-portion side end portion 13 of the base-end side curved arm piece 12 as a boundary. They are constituted with a ratio which will be described below. Moreover, the base-end side curved arm piece 12 is assumed to be divided into the base end portion 12c and the distal end portion 12d (See FIG. 4) at a connection portion 16 with a base-end portion side end portion 15 of the distal-end side curved arm piece 11 as a boundary. They are constituted with a ratio which will be described below.

Moreover, the distal end portion 11b of the distal-end side curved arm piece 11 and the distal end portion 12d of the base-end side curved arm piece 12 are connected to each other annularly so as to constitute a swollen portion 18. This swollen portion 18 is formed having a substantially elliptic shape. This annular swollen portion 18 is hollow.

Figure 8:
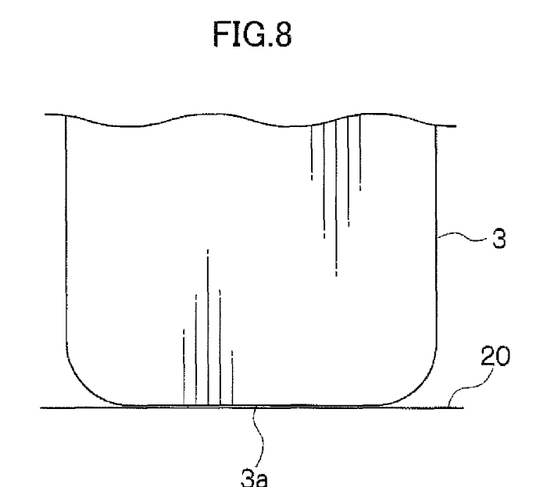
FIG. 8 is an enlarged view of an essential part showing a state in which a flat surface of the contact portion of the contact probe according to the embodiment of the present invention conforms to a surface of the electrode pad.
Figure 9:
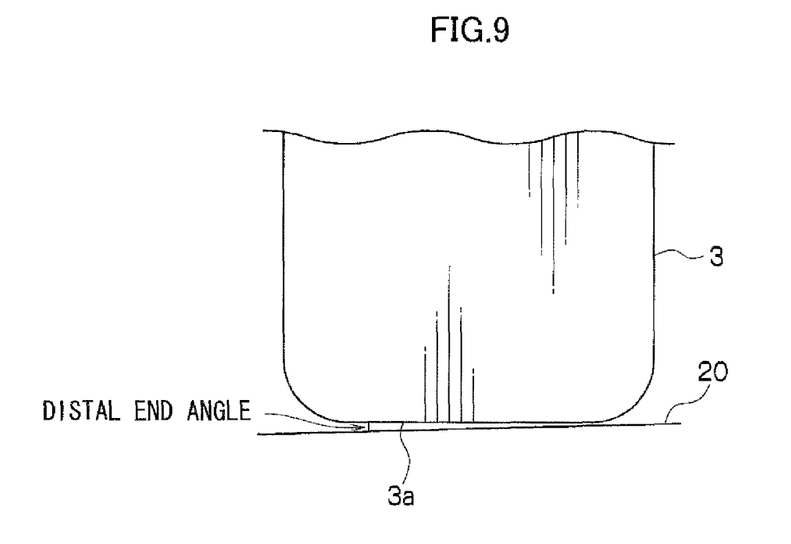
FIG. 9 is an enlarged view of the essential part showing a state in which the flat surface of the contact portion of the contact probe according to the embodiment of the present invention is inclined to the surface of the electrode pad.

The upper arm piece 9 provided with such swollen portion 18 has an adjusting function. This adjusting function is specifically such that the distal-end side curved arm piece 11 and the base-end side curved arm piece 12 are deflected (elastically deformed) by an external force (a reaction force when the contact portion 3 is brought into contact with the electrode pad of the circuit to be tested). As a result, the curvatures thereof are changed, the upper arm piece 9 is extended/contracted so as to directly adjust the inclination angle of the base portion 7, and a distal end angle of the contact portion 3 is indirectly adjusted by this adjustment of the inclination angle of the base portion 7. Here, the distal end angle is an angle formed by a flat surface 3a (See FIG. 8) on the distal end (lower end) of the contact portion 3 and a surface 20 (See FIG. 8) of the electrode pad. The distal end angle is 0 degrees in a state where the flat surface 3a of the contact portion 3 conforms to the surface 20 of the electrode pad (the state of FIG. 8 in which an inclination angle of the base portion 7 is 0 degrees, and there is no gap between the flat surface 3a of the contact portion 3 and the surface 20 of the electrode pad). When the base portion 7 is inclined, and the flat surface 3a of the contact portion 3 is inclined with respect to the surface 20 of the electrode pad, the distal end angle becomes larger (See FIG. 9).

The inclination angle of the base portion 7 is adjusted in order to absorb a shift (a shift protruding to the outside of the electrode pad) of the contact portion 3. The distal end angle of the contact portion 3 is adjusted in order to bring the flat surface 3a of the contact portion 3 and the surface 20 of the electrode pad into contact with each other with as large area as possible favorably by reducing this distal end angle. At this time, the inclination angle of the base portion 7 is adjusted prior to the adjustment of the distal end angle of the contact portion 3. Specifically, first, the inclination angle of the base portion 7 is adjusted so that the contact portion 3 does not protrude out of the electrode pad and then, adjustment is made so that the distal end angle of the contact portion 3 becomes as small as possible within a range where the contact portion 3 does not protrude out of the electrode pad.

At this time, the swollen portion 18 is configured to be swollen in a direction to become closer to a circle from the state of an elongated substantially elliptic shape in accordance with the OD amount by elastically deforming by an external force. As a result, the inclination angle of the base portion 7 (distal end angle of the contact portion 3) is corrected and adjustment is made so that the scrub amount of the contact portion 3 is made smaller (at least to be within the dimension of the electrode pad). That is, the inclination of the base portion 7 is corrected by the swollen portion 18 so as to have a rocking motion amount equal to the vertical probe.

Analysis Example

Subsequently, the scrub amount of the contact portion 3 was analyzed by changing the ratios (11a:11b, 12c:12d) between the base end portion 11a and the distal end portion 11b of the distal-end side curved arm piece 11 and the base end portion 12c and the distal end portion 12d of the base-end side curved arm piece 12 of the above-described configuration. The FEM analysis method was used for this analysis.

Here, the arm with the ratio of 11a:11b=3:7, 12c:12d=3:7 was actually made as a trial and evaluated and also, analysis was made by changing the ratio as appropriate. That is, while 12c:12d=3:7 is fixed, 11a:11b was changed, and analysis was made. Moreover, while 11a:11b=3:7 was fixed, 12c:12d was changed, and analysis was made. As a result, the following result in Table 1 was obtained.

TABLE 1

|  | 11a:11b | 12c:12d |
|---|---|---|
| (1) | 1:9 | 3:7 |
| (2) | 2:8 | 3:7 |
| (3) | 3:7 | 3:7 |
| (4) | 4:6 | 3:7 |
| (5) | 5:5 | 3:7 |
| (6) | 6:4 | 3:7 |
| (7) | 3:7 | 1:9 |

TABLE 1-continued

|  | 11a:11b | 12c:12d |
|---|---|---|
| (8) | 3:7 | 2:8 |
| (9) | 3:7 | 3:7 |
| (10) | 3:7 | 4:6 |
| (11) | 3:7 | 5:5 |
| (12) | 3:7 | 6:4 |

In the above-described Table 1, the other ratio (11a:11b, 12c:12d) is set to 1:9 to 6:4 when one ratio is fixed to 3:7 is because if the ratio is larger than these ratios (7:3, 8:2, and 9:1), the swollen portion 18 cannot be formed.

Figure 1:
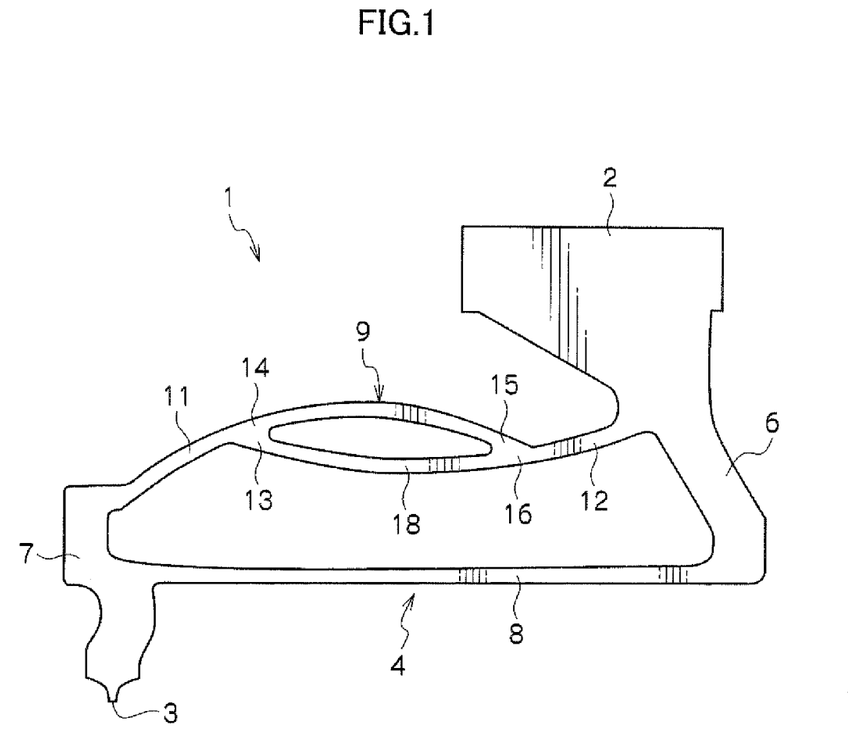
FIG. 1 is a front elevational view showing a contact probe according to an embodiment of the present invention.
Figure 2:
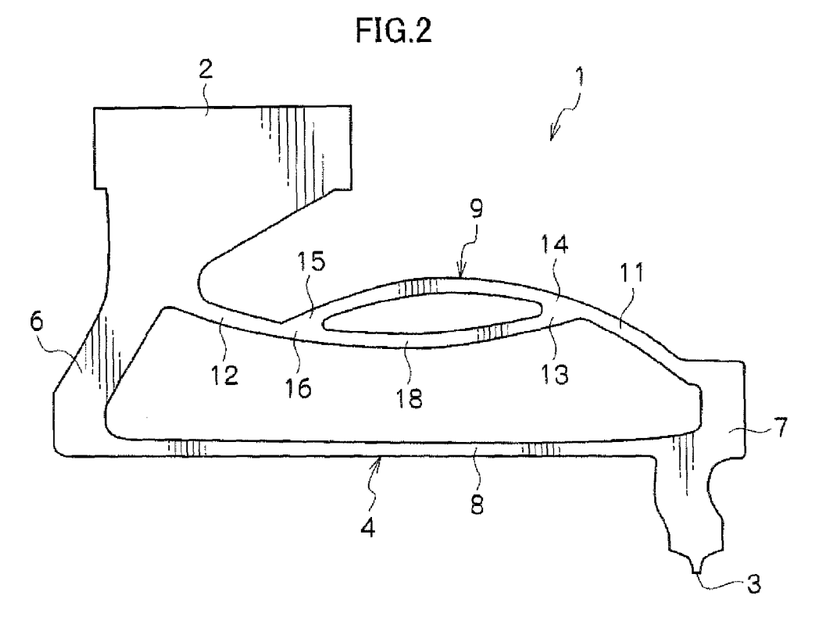
FIG. 2 is a rear elevational view showing the contact probe according to the embodiment of the present invention.
Figure 3:
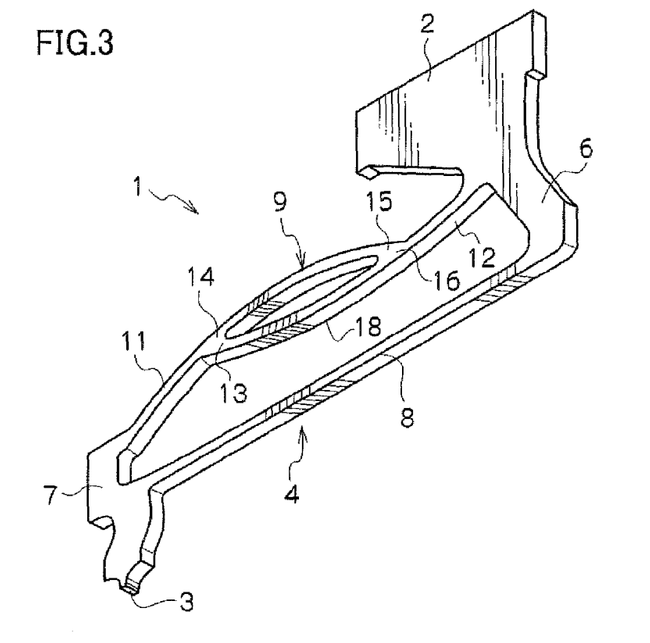
FIG. 3 is a perspective view showing the contact probe according to the embodiment of the present invention.
Figure 4:
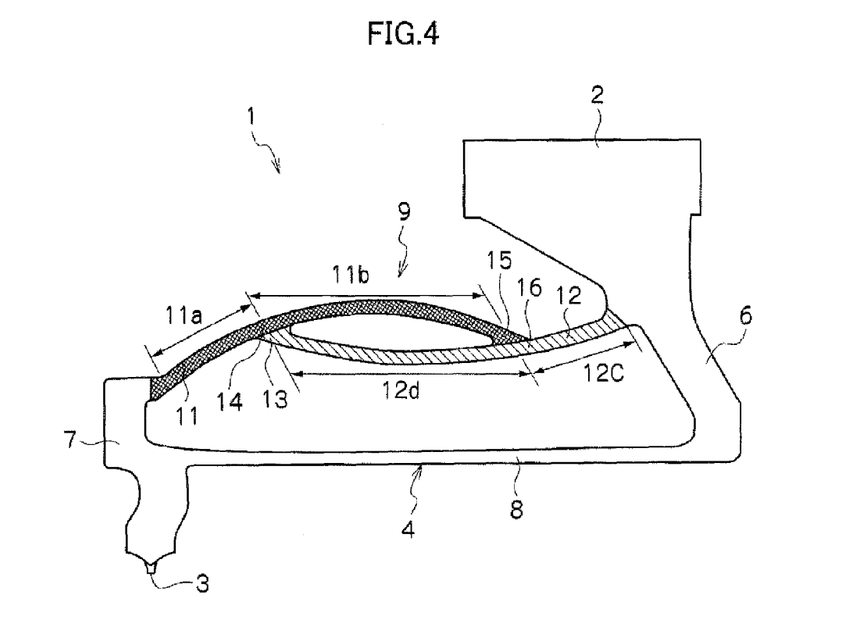
FIG. 4 is a front elevational view showing a ratio of a distal-end side curved arm piece and a base-end side curved arm piece of the contact probe according to the embodiment of the present invention.
Figure 5:
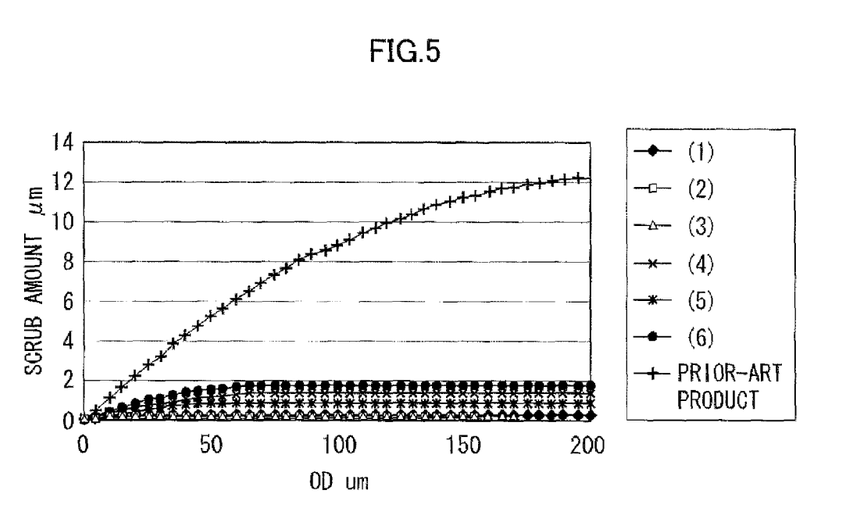
FIG. 5 is a graph showing a relationship between an overdrive amount and a scrub amount of a contact portion when ratios ($11a:11b$, $12c:12d$) between a base end portion $11a$ and a distal end portion $11b$ of a distal-end side curved arm piece and between a base-end portion $12c$ and a distal-end portion $12d$ of a base-end side curved arm piece of the contact probe according to the embodiment of the present invention are changed as appropriate.
Figure 6:
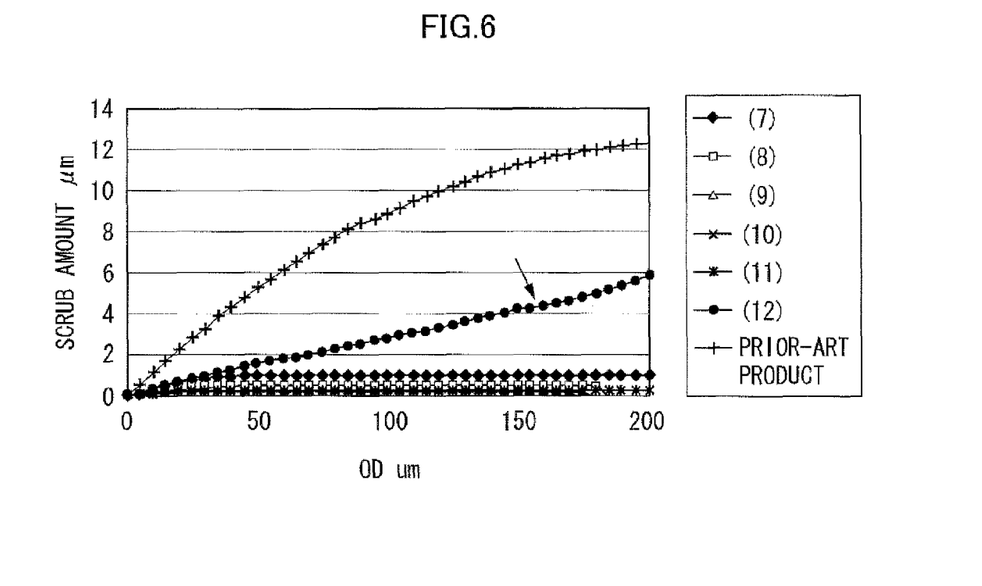
FIG. 6 is a graph showing a relationship between the overdrive amount and the scrub amount of the contact portion when ratios ($11a:11b$, $12c:12d$) between the base end portion $11a$ and the distal end portion $11b$ of the distal-end side curved arm piece and between the base-end portion $12c$ and the distal-end portion $12d$ of the base-end side curved arm piece of the contact probe according to the embodiment of the present invention are changed as appropriate.

The results of analysis of these combinations are shown in Graph 1 and Graph 2 in FIGS. 5 and 6, respectively. The graph 1 shown in FIG. 5 shows the result of a prior-art product and the contact probe 1 with the ratios of (1) to (6) in the above-described Table 1. The graph 2 shown in FIG. 6 shows the result of a prior-art product and the contact probe 1 with the ratios of (7) to (12) in the above-described Table 1.

In Graph 1 in FIG. 5, while the scrub amount increased substantially linearly nearly in proportion to an increase of the OD amount in the prior-art product, in the case of the contact probe 1 with the ratios of (1) to (6) in the above-described Table 1, a change of the scrub amount was small regardless of the increase of the OD amount. On the other hand, in Graph 2 in FIG. 6, in the case of the contact probe 1 with the ratio (12) in the above-described Table 1 (a:b=3:7, c:d=6:4), the scrub amount increased substantially linearly nearly in proportion to the OD amount similarly to the prior-art product. In the case of the contact probe 1 with the other ratios, the change of the scrub amount was small regardless of the increase of the OD amount. That is, in the case of the contact probe 1 with the ratios (1) to (11) in the above-described Table 1, the scrub amount rarely changed within a range of the OD amount of approximately 30 to 180 μm. This indicates that the scrub amount does not change but is stable even if the OD amount is changed within a range of 30 to 180 μm.

Figure 7:
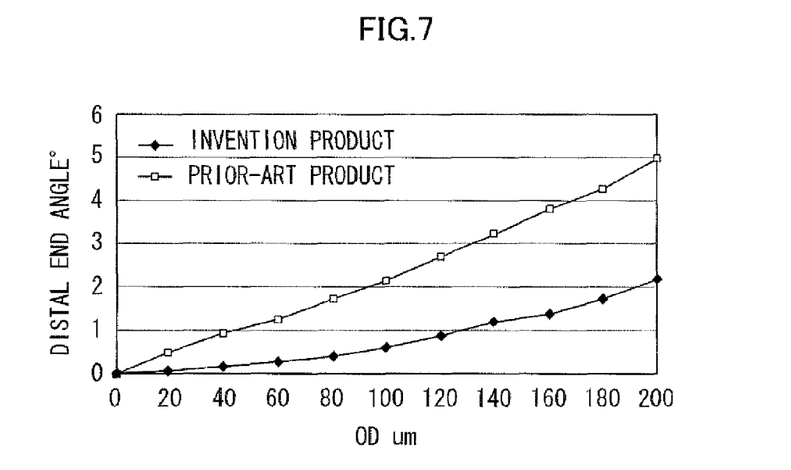
FIG. 7 is a graph showing a relationship between the overdrive amount and a distal-end angle of the contact portion of the contact probe according to the embodiment of the present invention.

Moreover, a relationship between the OD amount and the distal end angle of the contact portion 3 is shown in a graph in FIG. 7. As is known from this graph, both in the prior-art product and the product of the present invention (11a:11b=3:7, 12c:12d=3:7 in the shown example), the distal end angle of the contact portion 3 becomes larger as the OD amount increases, and regarding a change amount of this distal end angle, the invention product becomes smaller than the prior-art product. That is, it indicates that a rocking motion is smaller. For example, with the OD amount of 100 μm, the change amount of the distal end angle of the invention product is approximately 25% of the prior-art product. This difference in the distal end angle is caused by the function of the upper arm piece 9 of adjusting the above-described ratio.

If the arm portion 4 is composed of a normal parallel link mechanism, the base portion 7 makes parallel movement while drawing an arc. That is, the base portion 7 makes parallel movement while drawing an arc having a joint portion between the arm portion 4 and the support rod portion 6 as the rotation center and the whole length of the arm portion 4 as a radius without changing its inclination angle. As a result, the contact portion 3 protrudes out of the electrode pad.

However, the upper arm piece 9 of the arm portion 4 has a special shape provided with the swollen portion 18 and extends/contracts and inclines the distal end angle of the contact portion 3 with an angle smaller than that of the prior-art product in accordance with the OD amount as in the graph in FIG. 7. This angle is an angle to solve protrusion of the contact portion 3 to the outside of the electrode pad. That is, the shift of the contact portion 3 (the shift to protrude to the outside of the electrode pad) caused by the parallel movement (parallel movement drawing an arc) of the base portion 7 is absorbed, and as in FIGS. 5 and 6, it is an angle to make adjustment so that the scrub amount of the contact portion 3 rarely changes.

As a result, when the base portion 7 makes parallel movement while drawing an arc having the whole length of the lower arm piece 8 of the arm portion 4 as the radius, the upper arm piece 9 is deflected, the swollen portion 18 is deformed and inclined only by the set angle so as to absorb the shift caused by the parallel movement, thereby preventing the scrub amount of the contact portion 3 from changing.

Thus, those with the ratio of 11a:11b within the range of 1:9 to 6:4 and those with the ratio of 12c:12d within the range of 1:9 to 5:5 are assumed to be the optimal configuration of the upper arm piece 9 of this embodiment.

[Effect]

Even if the effective OD amount applied to each contact probe 1 varies by distortion of the probe card and the like, the scrub amount in each contact probe 1 can be within a certain range. That is, since the scrub amount is substantially constant and rarely changes regardless of the difference in the OD amount, even if the heights of the plurality of contact probes 1 vary and the heights of the contact portions 3 vary due to distortion of the probe card or the like, the scrub amounts of the contact portions 3 have substantially no difference.

As a result, even if the heights of the plurality of contact probes 1 vary or the like, a uniform scrub mark can be obtained without adjusting it. As a result, since each contact portion 3 can be accurately brought into contact with each electrode pad, inspection accuracy is improved, and reliability of the tester is improved.

Moreover, a uniform scrub mark can be obtained, and since rocking motion is also small, an abrasion amount of the distal end during distal end cleaning of each contact portion 3 becomes smaller, and the life of each contact portion 3 can be prolonged.

Moreover, as in Graph in FIG. 7, since the point where the rocking motion of each contact portion 3 is small is close to the vertical probe, the contact probe 1 of this embodiment can be used instead of the vertical probe. That is, by making the distal end shape of each of the above-described contact portion 3 and the scrub mark the same as the distal end shape of the vertical probe and the scrub mark, the contact probe 1 of this embodiment can be used even for test pieces (solder bump and the like, for example) for which inspection has been conducted by using the vertical probe.

As a result, since arrangement with a small pitch is made possible by using the contact probe 1 of this embodiment instead of the vertical probe, contact measurement inspection to the electrode pad with a small pitch which has been difficult with the vertical probe is made possible.

Moreover, the distal end dimension of the contact portion 3 to the electrode pad is as in Table 2 below:

TABLE 2

|  | 2006 | | 2007 | | 2008 | | 2009 | | 2010 | | 2011 | |
|---|---|---|---|---|---|---|---|---|---|---|---|---|
|  | X | Y | X | Y | X | Y | X | Y | X | Y | X | Y |
| Electrode pad dimension (μm) | 65 | 70 | 55 | 65 | 50 | 60 | 50 | 60 | 50 | 60 | 50 | 60 |
| Distal end size | large | | large | | large | | large | | medium | | medium | |
| Distal end occupancy rate in electrode pad | 4.12% | | 4.12% | | 5.24% | | 6.25% | | 4.33% | | 4.33% | |
| Scrub mark occupancy rate in electrode pad | 4.86% | | 6.18% | | 7.37% | | 7.37% | | 5.33% | | 5.33% | |

|  | 2012 | | 2013 | | Invention Product | | Invention product | | Invention product | |
|---|---|---|---|---|---|---|---|---|---|---|
|  | X | Y | X | Y | X | Y | X | Y | X | Y |
| Electrode pad dimension (μm) | 45 | 55 | 40 | 50 | 40 | 50 | 30 | 40 | 27 | 37 |
| Distal end size | small | | small | | small | | small | | small | |
| Distal end occupancy rate in electrode pad | 4.04% | | 5.00% | | 5.00% | | 8.30% | | 10.01% | |
| Scrub mark occupancy rate in electrode pad | 5.25% | | 6.50% | | 2.50% | | 4.17% | | 5.01% | |

Here, a distal end occupancy rate of the contact portion 3 in the electrode pad is calculated by a formula of distal end size/electrode pad area. An occupancy rate of the scrub mark in the electrode pad is calculated by a formula of scrub mark size/electrode pad area.

As in Table 2, the electrode pad dimension is getting smaller year by year, and that trend is expected to continue. In the prior-art technology, the distal end size has been made smaller in accordance with the electrode pad dimension, but since the distal end strength decreases with the size reduction, it is difficult to make the distal end size smaller than the current size. Thus, as the electrode pad dimension decreases, the distal end occupancy rate of the contact portion 3 in the electrode pad only increases.

Moreover, the scrub mark occupancy rate in the electrode pad is preferably 5% or less, considering an edge margin of the pad, but it exceeds 6% on a road map in 2013 and after.

On the other hand, with the present invention product, the scrub mark occupancy rate in the electrode pad can be decreased without changing the size of the distal end, and the size of the electrode pad dimension which can be accommodated can be also reduced to 27×37 μm$^2$ at the minimum.

As a result, the contact probe 1 of the present invention can accommodate further size reduction of the electrode pad.

[Variation]

In the above embodiment, the swollen portion 18 is provided on the upper arm piece 9 of the arm portion 4, but the swollen portion 18 might be provided on the lower arm piece 8. In the above-described embodiment, since the arm portion 4 is disposed horizontally, if overdrive is applied, the base portion 7 on the distal end is moved so as to draw an arc to the base end side on the upper side (the upper right side in FIG. 1). However, if the arm portion 4 is arranged below the horizontal line, the base portion 7 on the distal end moves so as to draw an arc to the distal end side on the upper side (the upper left side in FIG. 1) contrary to the above until the arm portion 4 becomes horizontal. In this case, the swollen portion 18 is provided on the lower arm piece 8 of the arm portion 4, and the base portion 7 is controlled so as to incline in a direction opposite to that in the above-described embodiment.

By means of this variation, the same actions and effects as those in the above-described embodiment can be exerted.

The present invention is not limited to the above-described embodiment or variation but can be embodied with variation of the constituent elements within a range not departing from the gist thereof in a practical stage. Moreover, various inventions can be formed by combining the plurality of constituent elements disclosed in the above-described embodiment and variation as appropriate.

The invention claimed is:

1. A contact probe to be supported by a probe card substrate on a tester side for extension to an electrode pad of a circuit to be tested for electrically connecting the tester side and the electrode pad of the circuit to be tested, comprising:
    a mounting portion located on a base end portion and for mounting on the probe card substrate on the tester side, a contact portion located on a distal end portion for contact with the electrode pad of the circuit to be tested, and an arm portion located between them and elastically supporting the contact portion, wherein
    the contact portion is provided on a lower end portion of a base portion integrally mounted on a distal end portion of the arm portion; and
    the arm portion is provided with a one-side arm piece supporting the base portion and allowing vertical movement of the base portion and the other-side arm piece supporting the base portion and adjusting an inclination angle of the base portion so as to reduce a scrub amount of the contact portion; and wherein
    the other-side arm piece is composed of a first distal-end side curved arm piece extending from the distal end portion side, a second base-end side curved arm piece extending from the base end portion side, and a third annular swollen piece connecting the distal-end side curved arm piece and the base-end side curved arm piece to each other.

2. The contact probe according to claim 1, wherein
    the distal-end side curved arm piece and the base-end side curved arm piece are deflected by an external force accompanying overdrive and the swollen portion is elastically deformed thereby and adjusts an inclination angle of the base portion so as to adjust a distal end angle of the contact portion.

3. The contact probe according to claim 2, wherein
    the swollen portion absorbs a shift of the contact portion protruding out of the electrode pad caused by parallel movement of the base portion drawing an arc and makes adjustment so that a scrub amount of the contact portion rarely changes.

4. A probe card supporting a plurality of contact probes for contact with an electrode pad of a circuit to be tested, wherein the contact probe according to claim 3 is used as the contact probe.

5. A probe card supporting a plurality of contact probes for contact with an electrode pad of a circuit to be tested, wherein the contact probe according to claim 2 is used as the contact probe.

6. A probe card supporting a plurality of contact probes for contact with an electrode pad of a circuit to be tested, wherein the contact probe according to claim 1 is used as the contact probe.

* * * * *